(12) United States Patent
Hattori et al.

(10) Patent No.: US 10,322,472 B2
(45) Date of Patent: *Jun. 18, 2019

(54) CU CORE BALL, SOLDER PASTE, FORMED SOLDER, CU CORE COLUMN, AND SOLDER JOINT

(71) Applicant: Senju Metal Industry Co., Ltd., Tokyo (JP)

(72) Inventors: Takahiro Hattori, Tochigi (JP); Daisuke Soma, Tochigi (JP); Takahiro Roppongi, Tochigi (JP); Isamu Sato, Tochigi (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 340 days.

This patent is subject to a terminal disclaimer.

(21) Appl. No.: 15/034,194

(22) PCT Filed: Nov. 4, 2014

(86) PCT No.: PCT/JP2014/079214
§ 371 (c)(1),
(2) Date: Aug. 12, 2016

(87) PCT Pub. No.: WO2015/068685
PCT Pub. Date: May 14, 2015

(65) Prior Publication Data
US 2016/0368105 A1  Dec. 22, 2016

(30) Foreign Application Priority Data
Nov. 5, 2013  (JP) .................. 2013-229493

(51) Int. Cl.
C22C 13/02 (2006.01)
B23K 35/30 (2006.01)
(Continued)

(52) U.S. Cl.
CPC .............. B23K 35/302 (2013.01); B22F 1/00 (2013.01); B22F 1/025 (2013.01); B23K 35/025 (2013.01);
(Continued)

(58) Field of Classification Search
CPC . H01L 2224/13347; H01L 2224/13147; H01L 2924/00014; H01L 2924/01029;
(Continued)

(56) References Cited

U.S. PATENT DOCUMENTS 6,158,644 A  12/2000  Brofman et al.
6,283,359 B1  9/2001  Brofman et al.
(Continued)

FOREIGN PATENT DOCUMENTS

CN  102470493 A  5/2012
EP  3012047 A1  4/2016
(Continued)

*Primary Examiner* — Erin B Saad
*Assistant Examiner* — Carlos J Gamino
(74) *Attorney, Agent, or Firm* — The Webb Law Firm

(57) ABSTRACT

Provided are a Cu core ball and a cu core column, which achieve dropping strength and strength against heat cycle. The Cu core ball (1) contains a Cu ball (2) made of Cu or a Cu alloy and a solder layer (3) which is made of a solder alloy composed of Sn and Cu and covers the Cu ball (2). The solder layer (3) contains not less than 0.1% through not more than 3.0% of Cu and the remainder is composed of Sn and impurities.

5 Claims, 2 Drawing Sheets

(51) Int. Cl.
| | |
|---|---|
| *B22F 1/00* | (2006.01) |
| *B23K 35/26* | (2006.01) |
| *B23K 35/22* | (2006.01) |
| *C22C 13/00* | (2006.01) |
| *B22F 1/02* | (2006.01) |
| *C22C 1/04* | (2006.01) |
| *H01L 23/00* | (2006.01) |
| *C25D 3/60* | (2006.01) |
| *H01L 23/556* | (2006.01) |
| *C25D 7/00* | (2006.01) |
| *B23K 35/02* | (2006.01) |
| *C22C 9/00* | (2006.01) |
| *C23C 28/02* | (2006.01) |
| *H05K 3/34* | (2006.01) |

(52) U.S. Cl.
CPC .......... *B23K 35/0222* (2013.01); *B23K 35/22* (2013.01); *B23K 35/26* (2013.01); *B23K 35/262* (2013.01); *C22C 1/0483* (2013.01); *C22C 9/00* (2013.01); *C22C 13/00* (2013.01); *C23C 28/021* (2013.01); *C25D 3/60* (2013.01); *C25D 7/00* (2013.01); *H01L 23/556* (2013.01); *H01L 24/13* (2013.01); *H01L 24/81* (2013.01); *B22F 1/0048* (2013.01); *H01L 24/05* (2013.01); *H01L 24/11* (2013.01); *H01L 24/16* (2013.01); *H01L 2224/0401* (2013.01); *H01L 2224/05647* (2013.01); *H01L 2224/11825* (2013.01); *H01L 2224/13012* (2013.01); *H01L 2224/13013* (2013.01); *H01L 2224/13014* (2013.01); *H01L 2224/13016* (2013.01); *H01L 2224/13017* (2013.01); *H01L 2224/13147* (2013.01); *H01L 2224/13294* (2013.01); *H01L 2224/13311* (2013.01); *H01L 2224/13347* (2013.01); *H01L 2224/13411* (2013.01); *H01L 2224/13455* (2013.01); *H01L 2224/13457* (2013.01); *H01L 2224/13561* (2013.01); *H01L 2224/13611* (2013.01); *H01L 2224/13655* (2013.01); *H01L 2224/13657* (2013.01); *H01L 2224/16145* (2013.01); *H01L 2224/16227* (2013.01); *H01L 2224/81024* (2013.01); *H01L 2224/81048* (2013.01); *H01L 2224/81075* (2013.01); *H01L 2224/81211* (2013.01); *H01L 2224/81395* (2013.01); *H01L 2224/81444* (2013.01); *H01L 2224/81447* (2013.01); *H01L 2224/81815* (2013.01); *H01L 2225/06513* (2013.01); *H01L 2225/06517* (2013.01); *H01L 2924/15311* (2013.01); *H01L 2924/351* (2013.01); *H05K 3/3463* (2013.01); *H05K 2201/0218* (2013.01)

(58) Field of Classification Search
CPC . H01L 2924/01047; H01L 2924/01013; H01L 2924/01015; H01L 2924/01016; H01L 2924/01026; H01L 2924/0103; H01L 2924/01033; H01L 2924/01044; H01L 2924/01048; H01L 2924/01049; H01L 2924/0105; H01L 2924/01051; H01L 2924/01082; H01L 2924/01083; H01L 2924/0109; H01L 2924/01092; H01L 2924/01203; H01L 2924/01204; H01L 2224/05647; H01L 2224/13311; H01L 2224/13411; H01L 2224/13455; H01L 2224/13457; H01L 2224/13611; H01L 2224/13655; H01L 2224/13657; H01L 2224/81024; H01L 2224/81444; H01L 2224/81447; H01L 2924/01028; H01L 2924/013; H01L 2224/0401; H01L 2224/11825; H01L 2224/13012; H01L 2224/13013; H01L 2224/13014; H01L 2224/13016; H01L 2224/13017; H01L 2224/13294; H01L 2224/13561; H01L 2224/16145; H01L 2224/16227; H01L 2224/81048; H01L 2224/81075; H01L 2224/81211; H01L 2224/81395; H01L 2224/81815; H01L 2225/06513; H01L 2225/06517; H01L 23/556; H01L 24/05; H01L 24/11; H01L 24/13; H01L 24/16; H01L 24/81; H01L 2924/15311; H01L 2924/351; B22F 1/00; B22F 1/0048; B22F 1/025; B23K 35/0222; B23K 35/025; B23K 35/22; B23K 35/26; B23K 35/262; B23K 35/302; C22C 13/00; C22C 1/0483; C22C 9/00; C25D 3/60; C25D 7/00; H05K 2201/0218; H05K 3/3463

See application file for complete search history.

(56) References Cited

U.S. PATENT DOCUMENTS

| | | | |
|---|---|---|---|
| 6,290,746 | B1 | 9/2001 | Yamamoto |
| 9,668,358 | B2 * | 5/2017 | Kawasaki ................ B22F 1/02 |
| 2002/0051728 | A1 * | 5/2002 | Sato ...................... B22F 1/0048 |
| | | | 420/562 |
| 2004/0007384 | A1 | 1/2004 | Soga et al. |
| 2010/0084765 | A1 | 4/2010 | Lee et al. |
| 2012/0305297 | A1 | 12/2012 | Nomoto et al. |
| 2014/0010705 | A1 | 1/2014 | Kanou |
| 2016/0148885 | A1 | 5/2016 | Kawasaki et al. |

FOREIGN PATENT DOCUMENTS

| | | | | |
|---|---|---|---|---|
| JP | 11317416 | A | | 11/1999 |
| JP | 11330126 | A | | 11/1999 |
| JP | 20052428 | A | | 1/2005 |
| JP | 200536301 | A | | 2/2005 |
| JP | 2006165336 | A | | 6/2006 |
| JP | 2007075856 | A | | 3/2007 |
| JP | 2007235091 | A | | 9/2007 |
| JP | 2010099736 | A | | 5/2010 |
| JP | 201129395 | A | | 2/2011 |
| JP | 2011029395 | A | * | 2/2011 |
| JP | 2011206815 | A | | 10/2011 |
| TW | 201015682 | A1 | | 4/2010 |
| WO | 2011089721 | A1 | | 7/2011 |
| WO | 2012120982 | A1 | | 9/2012 |
| WO | WO-2012120982 | A1 | * | 9/2012 ............... C22C 9/00 |

* cited by examiner

[FIG.1]
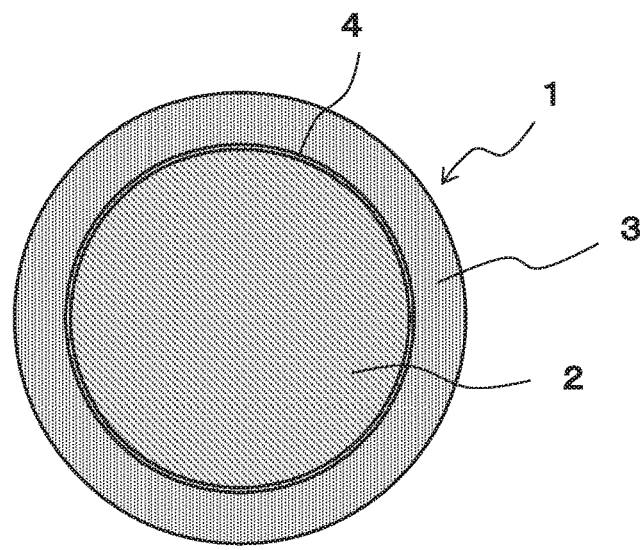
[FIG.2]
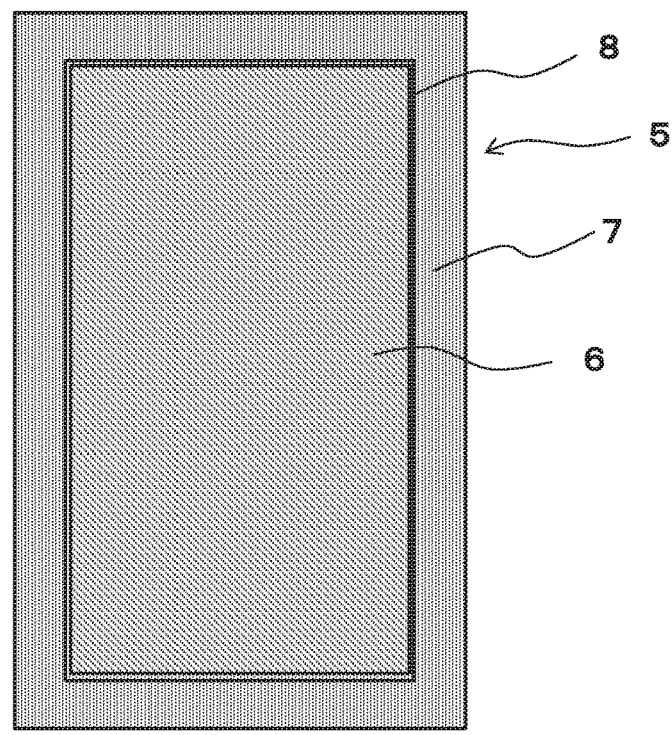

[FIG.3]
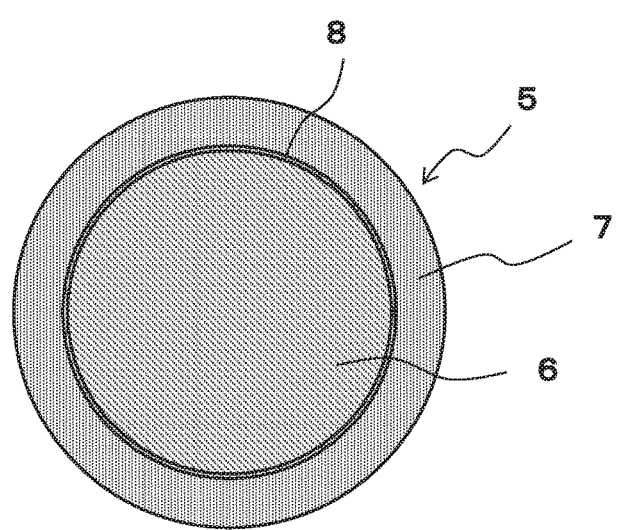

CU CORE BALL, SOLDER PASTE, FORMED SOLDER, CU CORE COLUMN, AND SOLDER JOINT

CROSS-REFERENCE TO RELATED APPLICATIONS

This application is the United States national phase of International Application No. PCT/JP2014/079214 filed Nov. 4, 2014, and claims priority to Japanese Patent Application No. 2013-229493 filed Nov. 5, 2013, the disclosures of which are hereby incorporated in their entirety by reference.

BACKGROUND OF THE INVENTION

Field of the Invention

The present invention relates to a Cu core ball in which a Cu ball is covered by a solder alloy, a solder paste using the Cu core ball, a formed solder using the Cu core ball, and a solder joint using the Cu core ball.

Description of Related Art

In recent years, with the development of small-size information equipment, rapid miniaturization has been advanced in electronic components mounted thereon. In order to cope with narrowing of connection terminals and reduction of mounting areas according to downsizing requirement, a ball grid array (hereinafter, referred to as "BGA") in which electrodes are arranged on the rear surface thereof is applied to the electronic component.

The electronic component to which BGA is applied is, for example, a semiconductor package. In the semiconductor package, a semiconductor chip having electrodes are sealed with any resin. Solder bumps are formed on the electrodes of semiconductor chip. Each solder bump is formed by connecting a solder ball which is formed by making the solder a ball or a solder column which is formed by making the solder a column to the electrode of the semiconductor chip. The semiconductor package to which BGA is applied is mounted on a printed circuit board in such a manner that each solder bump is in contact with a conductive land on the printed circuit board, and by connecting the solder bumps molded by heating to the land, the semiconductor package is mounted on the printed circuit board. In addition, in order to cope with the demand for higher density packaging, a three dimensional high density mounting structure, in which the semiconductor packages are piled along a height direction thereof, has been studied.

However, when BGA is applied to semiconductor packages to which the three dimensional high density mounting structure is applied, solder balls are collapsed by the self-weight of the semiconductor packages, so that short circuits occur between the electrodes. This may hinder the high-density packaging.

Therefore, solder bumps using, for example, a Cu core ball or a Cu core column, in which a ball having a micro-diameter or a column made of metal such as Cu having a higher melting point than that of a solder is formed as a core, and the surface of the ball or column is covered by the solder, have been studied. In the solder bumps each having the Cu ball or the like, the semiconductor package can be supported by the Cu ball which is not molded at the melting point of the solder even if the weight of the semiconductor packages is applied to the solder bumps during packaging of the electronic components on the printed circuit board. Accordingly, the solder bumps are not collapsed by the self-weight of the semiconductor packages. Patent Document 1 is illustrated as an example of the technologies related to the Cu core ball.

PRIOR ART DOCUMENTS

Patent Document

Patent Document 1: Japanese Patent Application Publication No. 2010-99736

SUMMARY OF THE INVENTION

The Problems to be Solved by the Invention

By the way, solder bumps made using the solder ball, the solder column, the Cu core ball, or the Cu core column are required to have strength against impacts such as dropping, and strength against stretching by temperature change referred to as "heat cycle".

A solder ball made of a solder alloy containing Ag achieves desired levels in both of dropping strength and strength against heat cycle. Even with a solder alloy referred to as low-Ag in which the additive amount of Ag is reduced to about 1.0% for cost saving of the solder alloy, the desired levels in both of dropping strength and strength against heat cycle are achieved.

On the other hand, a solder ball made of a solder alloy free from Ag achieves a desired level of dropping strength, but deteriorates in the strength against heat cycle.

The problems of the present invention are to achieve desired dropping strength and strength against heat cycle in a Cu core ball at the same level as or more than those of a solder ball or a solder column, and to provide such a Cu core ball, a solder paste, a formed solder, and a solder joint, which use the Cu core ball.

SUMMARY OF THE INVENTION

The inventors have found that a Cu core ball in which a Cu ball is covered by an Ag-free solder alloy has an equal dropping strength and a higher strength against heat cycle in comparison with the solder ball made of an Ag-free solder alloy.

In various aspects, the present disclosure may be characterized by one or more of the following clauses:

(1) A. Cu core ball including a spherical core layer and a solder layer made of a solder alloy composed of Sn and Cu, the solder layer covering the core layer wherein in the core layer, purity of Cu is not less than 99.9% through not more than 99.995%; a content of either Pb or Bi, or a total content of Pb and Bi is 1 ppm or more; a content of U is 5 ppb or less; a content of Th is 5 ppb or less; sphericity is 0.95 or more and an emitting α dose is 0.0200 eph/cm2 or less; and wherein in the solder layer, a content of U is 5 ppb or less; a content of Th is 5 ppb or less; and an α dose emitting from the Cu core ball is 0.0200 cph/cm2 or less.

(2) The Cu core ball of the above item (1), wherein the solder layer contains not less than 0.1% through not more than 3.0% of Cu, the remainder being composed of Sn and impurities.

(3) The Cu core ball of the above item (2), wherein the core layer covered by a layer made of at least one element selected from Ni and Co is covered by the solder layer.

(5) A solder paste including the Cu core ball of any one of the above items (1) to (3).

(6) A formed solder including the Cu core ball of any one of the above items (1) to (3).

(7) A solder joint including the Cu core ball of any one of the above items (1) to (3).

Effects of the Invention

In various examples, the present invention achieves desired levels in both of dropping strength and strength against heat cycle. Although the solder ball prepared from the Ag-free solder alloy has reduced the strength against heat cycle as compared with the solder ball prepared from the Ag-containing solder alloy, in the present invention, required dropping strength and improved strength against heat cycle are achieved as compared with the Cu core ball prepared from the Ag-containing solder alloy.

BRIEF DESCRIPTION OF DRAWINGS

FIG. 1 is a schematically cross sectional view of a Cu core ball according to an embodiment of the present invention for showing a configuration thereof;

FIG. 2 is a schematically cross sectional side view of a Cu core column according to an embodiment of the present invention for showing a configuration thereof; and FIG. 3 is a schematically cross sectional plane view of the Cu core column according to the embodiment of the present invention for showing the configuration thereof.

DESCRIPTION OF THE INVENTION

The following will describe an embodiment below more in detail in which this invention is applied to a Cu core ball. In the present description, the units relating the composition of the Cu core ball (ppm, ppb, and %) represent the proportions with reference to the mass (mass ppm, mass ppb, and % by mass), unless otherwise specified.

FIG. 1 is a schematically cross sectional view of a Cu core ball according to an embodiment of the present invention for showing a configuration thereof. The Cu core ball 1 of the present embodiment includes a Cu ball 2, and a solder layer 3 covering the Cu ball.

The solder layer 3 is made of an Ag-free solder alloy composed of not less than 0.1% through not more than 3.0% of Cu, the remainder being Sn, and the solder layer 3 is formed by subjecting the surface of the Cu ball 2 to solder plating. The Cu ball 2 is made of Cu or a Cu alloy containing 50% or more of Cu.

In the Cu core ball 1, a diffusion prevention layer 4 is formed between the Cu ball 2 and the solder layer 3. The diffusion prevention layer 4 is made of at least one element selected from Ni, Co, or others, and prevents Cu constituting the Cu ball 2 from diffusing into the solder layer 3.

The Cu core ball 1 in which the solder layer 3, which is made of a solder alloy having an Ag-free composition and has an additive amount of Cu not less than 0.1% through not more than 3.0%, the remainder being Sn, is formed on a surface of the Cu ball 2 achieves desired levels in both of strength against impacts such as dropping, and strength against stretching by temperature change referred to as heat cycle, even if the object to be jointed is a Cu—OSP substrate composed of a Cu layer whose surface has been subjected to pre-flux treatment, or an electrolytically Ni/Au plated substrate composed of a Cu layer whose surface has subjected to electrolytic Ni/Au plating.

The solder ball made of an Ag-free solder alloy shows lower strength against heat cycle in comparison with a solder ball made of an Ag-containing solder alloy. In the Cu core ball 1 of the present embodiment, the solder layer 3 is made of an Ag-free solder alloy, but achieves desired dropping strength and higher strength against heat cycle in comparison with a Cu core ball made of an Ag-containing solder alloy.

In the solder bump in which the Cu core ball 1 is used, the semiconductor package can be supported by the Cu ball which is not melted at the melting point of the solder alloy even if the weight of the semiconductor packages is applied to the solder bump. Accordingly, the solder bumps is not collapsed by the self-weight of the semiconductor packages.

By the way, the miniaturization of electronic components allows high-density packaging, but high-density packaging causes software error problems. Software errors are caused by rewriting of the memory which can be caused by the entry of α-ray into the memory cells of a semiconductor integrated circuit (hereinafter referred to as "IC").

It is considered that the α-ray is emitted by α-decay of radioisotopes such as U, Th, and $^{210}$Po as impurities contained in a solder alloy. Therefore, solder alloys having a composition that can achieve a low α dose are under development.

In the Cu core ball 1, the Cu ball 2 is covered by the solder layer 3, so that the α-ray emitted from the Cu ball 2 is likely blocked if the solder alloy constituting the solder layer 3 achieves a low α dose. In the Cu ball 2, however, a composition which achieves such a low α dose is also required.

Furthermore, if the Cu core ball 1 has low sphericity, flowability during mounting and uniformity of the solder amount decrease when the solder bumps are formed. The sphericity is the degree of closeness to a sphere. Therefore, the Cu core ball 1 having high sphericity is desired.

The composition of the solder layer 3 is a lead-free solder alloy composed mainly of Sn, and is an Sn—Cu alloy from the viewpoint of strength against impacts such as dropping, and strength against heat cycle. In the Cu core ball 1, the thickness of the solder layer 3 is not particularly limited, preferably 100 μm (one side) or less, and commonly from 1 to 50 μm.

The solder layer 3 is formed by circulating the Cu ball 2 and plating solution. Circulation of the plating solution causes the salt formation and precipitation of the elements Pb, Bi, and Po in the plating solution. Once the deposits as salts are formed, they stably exist in the plating solution. Accordingly, the Cu core ball 1 according to the present invention reduces the radioactive element content in the solder layer 3 without inclusion of the deposits in the solder layer 3, and thus can reduce the α dose in the Cu core ball 1 itself.

The following will describe the composition of the solder layer 3 achieving a low α dose below more in detail.

U: 5 Ppb or Less, Th: 5 Ppb or Less

U and Th are radioactive elements so that it is required to limit their contents in order to suppress any software errors. The U and Th contents are respectively required to be 5 ppb or less so that the α dose of the solder plating film is 0.0200 cph/cm$^2$ or less. Further, preferably, the U and Th contents are respectively 2 ppb or less from a viewpoint of suppressing the software errors in the present or future high density mounting structure.

α Dose: 0.0200 Cph/Cm$^2$ or Less

The α dose of the Cu core ball according to this invention is 0.0200 cph/cm$^2$ or less. This is the α dose such that it does not cause any software errors in the high density mounting structure of the electronic components. The α dose of the Cu core ball 1 according to this invention is attained by limiting the α dose of the solder plating film 3 constituting the Cu core ball 1 to be 0.0200 cph/cm² or less. In addition, the α dose in the Cu core ball 1 is also achieved by, as will be described later, when the α dose in the Cu ball 2 is 0.0200 cph/cm² or less.

The Cu core ball 1 according to the invention is formed at least at 100 degrees C. so that it is difficult to consider that the contents of radioactive isotopes such as U, Th, $^{210}$Po, Bi, Pb and the like is decreased by vaporization of the radioactive isotopes. However, when plating is performed while the plating solution and the Cu ball 2 are flown, U, Th, Pb, Bi, and $^{210}$Po form salts thereof which are deposited in the plating solution. The deposited salts are electrically neutral and they are not brought into the solder plating film even when the plating solution is flown.

Accordingly, their contents in the solder plating film are considerably decreased. Therefore, the Cu core ball 1 according to the invention represents low α dose because such a solder plating film 3 covers it. From a viewpoint of suppressing any software errors in the higher density mounting structure, it is preferable that the α dose is 0.0020 cph/cm² or less. It is much preferable that the α dose is 0.0010 cph/cm² or less.

The lower limit of the impurity amount is not particularly limited, because the content of radioactive elements and the α dose decrease as the purity of the solder layer 3 constituting the Cu core ball 1 according to the present invention increases, or the impurity content in the solder layer 3 decreases. On the other hand, the upper limit is preferably 1000 ppm or less, more preferably 100 ppm or less, even more preferably 50 ppm or less, and particularly preferably 10 ppm or less, from the viewpoint of reducing the α dose.

The total impurity amount in the solder layer 3 is the total content of impurities other than Sn and Cu in the solder layer 3.

It is preferable that in particular, the Bi and Pb contents are lower in the impurities contained in the solder layer 3. Bi and Pb contain very small amounts of $^{210}$Bi and $^{210}$Pb as radioisotopes, respectively. Accordingly, the reduction of the Bi and Pb contents is considered to markedly reduce the α dose in the solder layer 3. Each of the Bi and Pb contents in the solder layer 3 is preferably 15 ppm or less, more preferably 10 ppm or less, and particularly preferably 0 ppm.

Then, the following will describe the composition, α dose, and sphericity of the Cu ball 2 constituting the Cu core ball 1 according to the present invention more in detail.

When the Cu core ball 1 according to the present invention is used in solder bumps, the Cu ball 2 constituting the Cu core ball 1 is not melted at the soldering temperature, so that it can reduce the variation in the solder joint height. Accordingly, it is preferable that the Cu ball 2 has high sphericity and small variation in the diameter thereof. In addition, as described above, it is preferable that the α dose in the Cu ball 2 is low as in the solder layer 3. The preferred embodiment of the Cu ball 2 will be described below.

U: 5 Ppb or Less, Th: 5 Ppb or Less

As described above, the U and Th are radioisotopes, and their contents may be required to be reduced to prevent software errors. Each of the U and Th contents may be required to be 5 ppb or less so as to make the α dose in the Cu ball 2 0.0200 cph/cm² or less. In addition, in order to prevent software errors in the present or future high-density packaging, each of the U and Th contents is preferably 2 ppb or less.

Cu Ball Purity: Not Less than 99.9% Through not More than 99.995%

The purity of the Cu ball 2 is 3N or more and 4N5 or less. In other words, the impurity element content in the Cu ball 2 is of 50 ppm or more. Here, the purity of metal materials such as Cu is referred to as 2N for 99%, 3N for 99.9%, 4N for 99.99%, and 5N for 99.999%. 4N5 means that the purity of the metal material is of 99.995%.

When the purity of Cu constituting the Cu ball 2 is within this range, a sufficient amount of crystal core for increasing the sphericity of the Cu ball 2 can be secured in the molten Cu. The reason for the increase in the sphericity will be specified as follows.

When the Cu balls are produced, the Cu material formed in the form of small pieces having a certain shape is melted by heating, and the molten Cu is formed into sphere by the surface tension and coagulated to make the Cu ball 2. During coagulation of the molten Cu from a liquid state, the crystal grains grow in the spherical molten Cu. At this moment, if impurity elements are abundant, these impurity elements work as crystal core, and hinder the growth of crystal grains. Accordingly, the spherical molten Cu forms the Cu ball 2 having a high sphericity owing to the inhibition of the growth of fine crystal grains.

On the other hand, if the amount of impurity elements is small, the amount of crystal core is relatively small, so that the grains grow into a certain direction without inhibition. As a result of this, spherical molten Cu is coagulated with the surface partly protruded. Such a Cu ball has a low sphericity. As the impurity elements, Sn, Sb, Bi, Zn, Fe, Al, As, Ag, In, Cd, Cu, Pb, Au, P, S, U, Th and the like are conceivable.

The lower limit of the purity is not particularly limited, but is preferably 3N or more, from the viewpoint of suppressing the α dose and preventing deterioration of electric conduction and heat conductivity of the Cu ball 2 caused by decrease of the purity. In other words, the content of the impurity elements excluding Cu in the Cu ball 2 is preferably less than 1000 ppm.

α Dose: 0.0200 Cph/Cm² or Less

The α dose in the Cu ball 2 is 0.0200 cph/cm² or less. This is α dose which will not cause problems of software errors in high-density packaging of electronic components. In the present invention, heating treatment is carried out again, in addition to the ordinary processes carried out for producing the Cu ball 2. Therefore, $^{210}$Po slightly remaining in the Cu material evaporates, and the Cu ball 2 exhibits a further lower α dose than that of the Cu material. The α dose is preferably 0.0020 cph/cm² or less, and more preferably 0.0010 cph/cm² or less, from the viewpoint of preventing software errors in higher density packaging.

Content of Either Pb or Bi, or Total Content of Pb and Bi is 1 Ppm or More

As impurity elements contained in the Cu ball 2, Sn, Sb, Bi, Zn, Fe, Al, As, Ag, In, Cd, Cu, Pb, Au, P, S, U, Th and the like are conceivable. It is preferable that the Cu ball 2 constituting the Cu core ball 1 according to the present invention particularly contains, among these impurity elements, a content of either Pb or Bi, or a total content of Pb and Bi which is 1 ppm or more as the impurity elements. In the present invention, in order to reduce the α dose, it is not required that the content of either Pb or Bi, or the total content of Pb and Bi is reduced to the minimum thereof. The reason is as follows.

$^{210}$Pb turns to $^{210}$Bi by β-decay, and $^{210}$Bi turns to $^{210}$Po by β-decay, and $^{210}$Po turns to $^{206}$Pb by α-decay. Therefore, in order to reduce the α dose, it seems that the content of either Pb or Bi or the content of Pb and Bi as impurity elements is preferably as low as possible.

However, the content ratios of $^{210}$Pb contained in Pb and of $^{210}$Bi contained in Bi are low. Accordingly, it seems that if the Pb and Bi contents are reduced to a certain degree, $^{210}$Pb and $^{210}$Bi are sufficiently removed to the degree which allows the reduction of the α dose to the above-described range. On the other hand, in order to increase the sphericity of the Cu ball 2, as described above, the impurity element content is preferably high. When both of Pb and Bi as impurity elements are contained in the Cu material, they work as crystal core during melting in the production process of the Cu ball 2 to increase the sphericity of the Cu ball 2. Therefore, it is preferred that either Pb or Bi or Pb and Bi are contained in an amount which allows the removal of $^{210}$Pb and $^{210}$Bi to the degree where the α dose is reduced to the above-described range. From this viewpoint, it is preferable that a content of either Pb or Bi, or a total content of Pb and Bi is 1 ppm or more.

It is more preferable that the content of either Pb or Bi, or the total content of Pb and Bi is 10 ppm or more. The upper limit thereof is not limited as long as the α dose is reduced, but it is more preferable that the content of either Pb or Bi, or the total content of Pb and Bi is less than 1000 ppm, from the viewpoint of suppressing deterioration of electric conductivity of the Cu ball 2. It is more preferable that the Pb content is from 10 ppm to 50 ppm and the Bi content is from 10 ppm to 50 ppm.

Sphericity of Cu Ball: 0.95 or More

It is preferable that the sphericity of the Cu ball 2 is 0.95 or more, from the viewpoint of controlling the stand-off height. If the sphericity of the Cu ball 2 is less than 0.95, the Cu ball has an indefinite shape, so that bumps having nonuniform heights are formed during bump formation, thereby increasing the possibility of occurrence of jointing defect. It is more preferable that the sphericity is 0.990 or more. In the present invention, sphericity represents the deviation from a true sphere. The sphericity is determined by various kinds of methods such as the least squares center method (LSC method), minimum zone center method (MZC method), the maximum inscribed center method (MIC method), or minimum circumscribed center method (MCC method). More specifically, sphericity is an arithmetic mean value calculated by dividing the diameter of each of the 500 Cu balls 2 by the major axis. The closer the value to the upper limit 1.00, the closer the true sphere. In the present invention, the length of the major axis and diameter are referred to as lengths measured by Ultra Quick Vision, ULTRA QV350-PRO, manufactured by Mitsutoyo Corporation.

Diameter of Cu Ball: 1 to 1000 μm

It is preferable that the diameter of the Cu ball 2 is from 1 to 1000 μm. When the diameter is within this range, the spherical Cu ball 2 is stably produced, and the short circuit caused by a narrow pitch between the terminals can be suppressed.

When describing a case to which the Cu core ball 1 according to the present invention is applied, the Cu core ball 1 is used in a solder paste made by mixing and kneading solder powder, the Cu core ball 1, and flux. Here, in a case where the Cu core ball 1 according to the present invention is used in the solder paste, the "Cu core ball" may be referred to as "Cu core powder".

"Cu core powder" is an aggregate of many Cu core balls 1, each of the Cu core balls 1 having the above-described properties. For example, the powder is contained in a solder paste, and is discriminated from a single Cu core ball in the use condition. In the same manner, the powder is usually used as an aggregate also when the powder is used for the formation of solder bumps, so that the "Cu core powder" used in such form is discriminated from a single Cu core ball. When "Cu core ball" is used in the form referred to as "Cu core powder", the diameter of the Cu core ball is generally from 1 to 300 μm.

In addition, the Cu core ball 1 according to the present invention is used for a formed solder in which the Cu core balls 1 are dispersed in solder. In the solder paste and the formed solder, for example, a solder alloy having a composition of Sn-3Ag-0.5Cu (each value is % by mass) is used. Further, the present invention is not limited to this solder alloy. Furthermore, the Cu core ball 1 according to the present invention is used for solder joints of electronic components. In addition, the present invention may be applied to the form of columns, pillars, and pellets including Cu as the core.

The following will describe an example of a method of manufacturing the Cu core ball 1 according to this invention.

The Cu material as material is put on a plate having heat-resisting property such as ceramics and is heated in a furnace together with the heat-resisting plate. There are many dimples each having a hemispheric bottom in the heat-resisting plate. A diameter of the dimple and a depth thereof are suitably set according to a diameter of the Cu ball. For example, the diameter thereof is 0.8 mm and the depth thereof is 0.88 mm. Further, the Cu materials each having a chip shape (hereinafter, referred to as "chip material"), which are obtained by cutting a fine wire made of Cu, are put into the dimples one by one in the heat-resisting plate.

The heat-resisting plate in which the chip material have been put into each of the dimples is heated up to 1100 through 1300 degrees C. in the furnace into which ammonia decomposition gas is filled and heating treatment is performed thereon during 30 through 60 minutes. In this moment, when temperature in the furnace is more than the melting point of Cu, the chip material is fused so that it becomes spherical. Thereafter, the interior of the furnace is cooled so that the Cu ball 2 is formed in each of the dimples of the heat-resisting plate. After the cooling, the formed Cu ball 2 is again heated at the temperature of 800 through 1000 degrees C. which is a temperature that is less than the melting point of Cu.

Further, as other methods, there are an atomizing method in which the fused Cu is dropped down from an orifice pierced through a bottom of a melting pot and the droplet is cooled to be granulated as the Cu ball 2 and a granulation method in which thermal plasma heats cut metal of Cu at a temperature of 1000 degrees C. or more. The Cu balls 2 thus granulated may be again heated respectively at a temperature of 800 through 1000 degrees C. during 30 through 60 minutes.

In the methods of manufacturing the Cu core ball 1 according to the invention, the Cu material which is a raw material of the Cu ball 2 may be heated at a temperature of 800 through 1000 degrees C. before the Cu ball 2 is granulated.

As the Cu material which is a raw material of the Cu ball 2, for example, pellet, wire, pillar or the like can be used. The Cu material may have a purity of 99.9% through 99.99% from a viewpoint such that the purity of the Cu ball does not too decrease.

In a case where the Cu material having a higher purity is used, a temperature for maintaining the fused Cu may decrease to a temperature of about 1000 degrees C., which is similar to a conventional one, without performing the above-mentioned heating treatment. Thus, the above-mentioned heating treatment may be suitably omitted or changed according to the purity of the Cu material and/or the α dose thereof. When manufacturing the Cu balls having high α dose or having no spherical shape, these Cu balls can be reused as a raw material, so that the α dose can be more decreased.

As the method of forming the plating film 3 on the Cu ball 2 by flowing the plating solution with the Cu balls 2 manufactured as described above, there are a electrolytic plating method such as a known barrel plating, a method of generating a high speed turbulent flow in the plating solution within a plating tank by a pump connected to the plating tank and forming the plating film on the Cu ball 2 by the turbulent flow in the plating solution, a method of providing a vibration plate in a plating tank to vibrate it at predetermined frequency so that the plating solution is agitated by high speed turbulent flow and forming the plating film on the Cu ball 2 by the turbulent flow in the plating solution and the like.

The following will describe an example in which a Cu ball having a diameter of 100 μm is covered by Ni plating with a film thickness of 2 μm (one side), and further Sn—Cu solder plating film with a film thickness of 18 μm is formed on the Ni plating, thereby producing a Cu core ball having a diameter of about 140 μm.

The Sn—Cu-containing plating solution according to one embodiment of the present invention includes a medium composed mainly of water, and sulfonic acids and Sn and Cu in the form of metal components as essential components.

The metal components exist in the form of Sn ion ($Sn^{2+}$ and/or $Sn^{4+}$) and Cu ion ($Cu^+$ and/or $Cu^{2+}$) in the plating solution. The plating solution is obtained by mixing a mother plating liquor, which is composed mainly of water and sulfonic acids, and metal compounds, and preferably contains an organic complex agent for stabilizing the metal ions.

As the metallic compounds in the plating solution, the following ones are exemplified, for instance.

As specific examples of the Sn compounds, first Sn compounds such as tan salts, tin sulfate, tin oxide, tin nitrate, tin chloride, tin bromide, tin iodide, tin phosphate, tin pyrophosphate, tin acetate, tin formate, tin citrate, tin gluconate, tin tartrate, tin lactate, tin succinate, tin sulfamate, tin borofluoride, tin silicofluoride and the like of organic sulfonic acid such as methanesulfonic acid, ethanesulfonic acid, 2-propanol sulfonic acid, p-phenol sulfonic acid and the like are exemplified. A single species of these Sn compounds can be used or two species or more thereof can be mixed and used.

As the Cu compounds, copper salts, copper sulfate, copper oxide, copper nitrate, copper chloride, copper bromide, copper iodide, copper phosphate, copper pyrophosphate, copper acetate, copper formate, copper citrate, copper gluconate, copper tartrate, copper lactate, copper succinate, copper sulfamate, copper borofluoride, copper silicofluoride and the like of the above-mentioned organic sulfonic acid are exemplified. A single species of these Cu compounds can be used or two species or more thereof can be mixed and used.

Further, when forming the plating film (film thickness of a single side of which is 18 μm) of Sn—Cu solder on a Ni-plated Cu ball having a diameter of 104 μm, a quantity of electricity of about 0.0101 coulombs is required.

Blending quantities of respective metals in the plating solution are as follows: As $Sn^{2+}$, 0.05 through 2 mol/L, preferably 0.25 through 1 mol/L; and As Cu, 0.002 through 0.02 mol/L, preferably 0.003 through 0.01 mol/L. Here, since it is $Sn^{2+}$ that relates to the plating, a quantity of $Sn^{2+}$ may be adjusted in this invention.

Further, a desired deposition amount of a solder plating is estimated according to a following formula (1) based on the Faraday's law of electrolysis and an amount of electricity therefor is calculated. The electric current flows through the plating solution so as to be the calculated amount of electricity and the plating is executed while the plating solution flows with the Cu balls. A volume of the plating tank may be fixed according to a total input amount of the Cu balls and the plating solution.

$$w(g)=(1 \times t \times M)/(Z \times F) \qquad \text{Formula (1)}$$

In the formula (1), w is an electrolytic deposition amount (g); 1 is electric current (A); t is electricity energizing time (second); M is an atomic weight of a deposited element (in a case of Sn, 118.71); Z is an atomic value (in a case of Sn, bivalent); and F is the Faraday constant (96500 coulombs). The quantity of electricity Q (A·Sec) is represented by 1×t.

Although the plating has been executed in this invention while the plating solution flows with the Cu balls, a flowing method thereof is not particularly limited. For example, the plating solution may flow with the Cu balls by a rotation of barrel like the barrel electrolytic plating method.

After the plating process is executed, any drying is executed in the air or under N2 atmosphere, so that it is possible to obtain the Cu core ball according to the invention.

Executed Examples

The following will describe examples of the Cu core ball 1 of the present invention, but the present invention is not limited to them.

<Dropping Strength and Heat Cycle Test>

A Cu core ball in which a solder layer was made of an Ag-free solder alloy, a Cu core ball in which a solder layer was made of an Ag-containing solder alloy, a solder ball made of an Ag-free solder alloy, and a solder ball made of an Ag-containing solder alloy were prepared, and the dropping strength test for measuring the strength against impacts such as dropping, and the heat cycle test for measuring the strength against stretching by heat cycle were carried out.

As the Cu core ball 1 shown in FIG. 1, in Executed Example 1, the Cu core ball 1 having a diameter of 300 μm was prepared. The Cu core ball 1 of Executed Example 1 was composed of the Cu ball 2 having a diameter of 250 μm, the diffusion prevention layer 4 made of Ni having a film thickness of 2 μm on one side, and the solder layer 3 made of an Sn—Cu alloy. The composition of the Sn—Cu alloy was Sn-0.7Cu, and tan additive amount of Cu in the solder layer 3 was 0.7%.

As a comparative example, in Comparative Example 1, a Cu core ball having a solder layer made of an Sn—Ag—Cu alloy was prepared. The composition of the Sn—Ag—Cu alloy was Sn-1.0Ag-0.7Cu. In Comparative Example 2, a solder ball was prepared from an Sn—Cu alloy having the same composition as Executed Example 1. In Comparative Example 3, a solder ball was prepared from an Sn—Ag—Cu alloy having the same composition as Comparative Example 1.

In the heat cycle test, using the Cu core balls and solder balls of the above-described Executed Examples and Comparative Examples, 15 pieces of the semiconductor package substrate (PKG) were jointed to a printed circuit board (PCB), and thus making an evaluation substrate. As the printed circuit board, a Cu—OSP substrate with a size of 174 mm×120 mm and a thickness of 0.8 mm was used, the substrate having a Cu layer whose surface had been subjected to pre-flux treatment. As the semiconductor package substrate, a Cu—OSP substrate with a size of 12×12 mm was used.

In the dropping strength test, using the Cu core ball and solder ball of the above-described Executed Examples and Comparative Examples, three pieces of the semiconductor package substrate were jointed to a printed circuit board, and thus making an evaluation substrate. As the printed circuit board, a Cu—OSP substrate with a size of 30 mm×120 mm and a thickness of 0.8 mm was used, the substrate having a Cu layer whose surface had been subjected to pre-flux treatment. As the semiconductor package substrate, a Cu—OSP substrate was used.

A resist film having a film thickness of 15 μm was formed on the semiconductor package substrates used in the heat cycle test and the dropping strength test, an opening having a diameter of 240 μm was formed in the resist film, and the Cu core balls or solder balls of Executed Example or Comparative Example were jointed in a reflow furnace. The reflowing conditions were as follows; both of the heat cycle test and dropping strength test were carried out in a N2 atmosphere with the peak temperature of 245° C., the preliminary heating was carried out at 140 to 160° C. for 20 seconds, and the main heating was carried out at 220° C. or higher for 40 seconds.

Thus, the semiconductor package substrates, to which the Cu core balls or the solder balls had been jointed, were mounted on the printed circuit boards for the heat cycle test and the dropping strength test, respectively. On the printed circuit board, a solder paste having a solder alloy composition of Sn-3.0Ag-0.5Cu was printed at a thickness of 100 μm and a diameter of 240 μm for both the heat cycle test and the dropping strength test. The semiconductor package substrates, to which the Cu core balls or the solder balls had been jointed, of Executed Example or Comparative Example, were connected to a printed circuit board in a reflow furnace. The reflowing conditions were as follows; this was carried out in the atmosphere with a peak temperature of 245° C., the preliminary heating was carried out at 140 to 160° C. for 70 seconds, and the main heating was carried out at 220° C. or higher for 40 seconds.

In the dropping strength test, the evaluation substrate thus made was fixed at the both ends using a special jig with it being floated from the base at the position 10 mm. In accordance with JEDEC standard, impacts of an acceleration of 1500 G were repeatedly applied, and the point at which the resistance value increased by 1.5 times in comparison with the initial resistance value was regarded as rupture, and the number of dropping was recorded.

In the heat cycle test, the resistance of the evaluation substrate thus made was continuously measured by a series circuit. Using a thermal shock apparatus TSA101LA manufactured by ESPEC Corp., treatments at −40° C. and +125° C. each for 10 minutes were set to be one cycle, the point at which the resistance value exceeded 15Ω was regarded as rupture, and the time of heat fatigue cycle when all the solder joints on the 15 semiconductor package substrates on the printed circuit board were destroyed was recorded. For one composition, 10 sets of evaluation substrates were prepared, ten times of test were carried out, and the average value was used as the result.

Table 1 shows the test result when the semiconductor package substrate was a Cu—OSP substrate composed of a Cu layer whose surface had been subjected to pre-flux treatment.

TABLE 1

|  | Executed Example 1 | Comparative Example 1 | Comparative Example 2 | Comparative Example 3 |
| --- | --- | --- | --- | --- |
| Dropping strength | >100 | >100 | >100 | >100 |
| Strength against heat cycle | 1734 | 1575 | 1328 | 2064 |

When the semiconductor package substrate was the Cu—OSP substrate having the Cu layer whose surface had been subjected to pre-flux treatment, as shown in Table 1, in the Cu core ball of Executed Example 1 having a solder layer made of an Sn—Cu alloy, the dropping strength was improved, and the strength against heat cycle was higher than the required 1500 times.

When the semiconductor package substrate was the Cu—OSP substrate, in the Cu core ball of Comparative Example 1 having a solder layer made of an Sn—Ag—Cu alloy, the desired dropping strength was achieved, but the strength against heat cycle was deteriorated.

When the semiconductor package substrate was the Cu—OSP substrate, in the solder ball of Comparative Example 2 made of an Sn—Cu alloy, the dropping strength was improved, but the strength against heat cycle was deteriorated. In the solder ball of Comparative Example 3 made of an Sn—Ag—Cu alloy, required values of the dropping strength and the strength against heat cycle were achieved.

As described above, when the object to be jointed was a Cu—OSP substrate, the Cu core ball of Executed Example 1 achieved sufficient dropping strength and strength against heat cycle.

Here, when the Cu core ball of Executed Example 1 was subjected to the dropping strength test and the heat cycle test with the additive amount of Cu in the solder layer being from 0.1% to 3.0%, both of the dropping strength and strength against heat cycle achieved the values higher than the required levels. However, when the additive amount of Cu is about 3.0%, the solder alloy has a high melting point. Therefore, it is preferable that the additive amount of Cu in the solder layer made of an Sn—Cu alloy is not less than 0.1% through not more than 2.0%.

<Measurement of α Dose>

In the next place, a Cu ball having high sphericity was prepared and the α dose of the Cu core ball in which a solder layer was formed on a surface of the Cu ball was measured.

Manufacture of Cu Ball

The manufacture condition of the Cu ball having the high sphericity was searched. Cu pellets each having a purity of 99.9%, Cu wires each having a purity of 99.995% or less and Cu plates each having a purity exceeding 99.995% were prepared. They were respectively put into the melting pot, the temperature of the melting pot was then risen to 1200 degrees C. and this heating treatment was performed during 45 minutes. The fused Cu was dropped down from an orifice pierced through the bottom of the melting pot and the droplet was cooled so as to be granulated as the Cu ball. Thus, the Cu balls having a mean diameter of 250 μm were manufactured. Table 2 shows a result of an elementary analysis and sphericity of the manufactured Cu balls.

Sphericity

The following will describe a method for measuring the sphericity more in detail. The sphericity was measured by CNC image measurement system. Equipment therefor was ultra quick vision, ULTRA QV350-PRO manufactured by MITSUTOYO Corporation.

α Dose

The method for measuring the α dose is as follows. The α dose was measured using α dose measurement equipment of a gas-flow proportional counter. A measurement sample was a 300×300 mm flat shallow container with the Cu balls spreading all over it. This measurement sample was put into the α dose measurement equipment and the α dose was measured after it stood for 24 hours under PR-10 gas flow.

Further, the PR-10 gas (90% of argon and 10% of methane) used in the measurement was the gas after more than three weeks was elapsed since the gas was filled in a gas bomb. It complied with a guideline of the method of measuring the α dose, which was prescribed by joint electron device engineering council (JEDEC), that the bomb was used after more than three weeks was elapsed, so that α ray did not occur by radon in the atmosphere, which might be inserted into the gas bomb.

The result of the elementary analysis and the α dose of the manufactured Cu balls is shown in the Table 2.

The solder plating solution was prepared as follows. a 54% by weight of methane sulfonic acid aqueous solution was all put into one third of water, which was required to a preparation of the plating solution, within a stirring container and they were put into the stirring container in advance. Subsequently, acetyl cysteine, which was an example of mercaptan compound that was a complexing agent, was put thereinto and after its dissolution was confirmed, 2, 2'-dithiodianiline, which was an example of aromatic amino compound that was another complexing agent, was put thereinto. When the liquid turned out to be a light blue gelled liquid, stannous trifluoromethanesulfonate was immediately put thereinto. In the next place, two thirds of the amount of water needing for the plating solution was put thereinto, and finally 3 g/L of α-naphthol polyethoxylate (EO 10 mol), which was one example of a surfactant, was put thereinto, thus completing the preparation of the plating solution. Thus, the plating solution indicating that methane

TABLE 2

| | Cu ball composition | | | | | | | | | | | | | | α dose | |
|---|---|---|---|---|---|---|---|---|---|---|---|---|---|---|---|---|
| | Cu | Sn | Sb | Bi | Zn | As | Ag | Cd | Ni | Pb | Au | P | S | U | Th | (cph/cm$^2$) | Sphericity |
| Cu balls made of 99.9% Cu pellets | bal. | 84 | 21 | 32 | 3 | 49 | 20 | 7 | 4 | 18 | 4 | 200 | 18 | 1.5 | <0.5 | <0.0010 | 0.9932 |
| Cu balls made of 99.995% or less Cu wire | bal. | 8 | 10 | 19 | — | 24 | 13 | — | 1 | 8 | — | — | — | <0.5 | <0.5 | <0.0010 | 0.9931 |
| Cu balls made of more than 99.995% Cu plate | bal. | 13 | 2 | 18 | — | 10 | — | — | 1 | 3 | — | — | — | 0.9 | <0.5 | <0.0010 | 0.9227 |

* The unit of the elemental analysis result of the alloy composition is mass ppb only for U and Th.
The units of the other elements and total impurity amount are mass ppm.

As shown in Table 2, both of the Cu balls made of Cu pellets having purity of 99.9% and the Cu balls made of the Cu wire having purity of 99.995% or less showed a sphericity of 0.990 or more. On the other hand, as shown in Table 2, the Cu balls made of a Cu plate having purity of more than 99.995% had a sphericity of lower than 0.95. Therefore, in the following Executed Examples and Comparative Examples, Cu core balls were prepared using Cu balls made of Cu wire having purity of 99.995% or less.

The Cu balls made of Cu wire having purity of 99.995% or less were covered by an Sn solder plating film under the following conditions, thereby making Cu core balls of Executed Example 2.

The Cu core balls of Executed Example 2 were subjected to plating treatment using the following plating solution, in such a manner that the Cu balls having a diameter of 250 μm were coated with a solder layer having a film thickness (one side) of 50 μm, at a quantity of electricity of about 0.17 coulomb. The cross section of the Cu core ball coated with a solder plating film was observed by a SEM photograph. The film thickness was about 50 μm. After the treatment, the balls were dried in the air, thereby obtaining Cu core balls.

sulfonic acid concentration in the plating solution was 2.64 mol/L, and tin ion concentration was 0.337 mol/L was prepared.

The stannous trifluoromethanesulfonate used in the present Executed Examples was prepared from the following Sn sheet material.

The elemental analysis of the Sn sheet material which was raw material of the solder plating solution, and the elemental analysis of the solder plating film formed on a surface of the Cu core ball were carried out by high frequency inductively coupled plasma mass spectrometry (ICP-MS analysis) for U and Th, and high frequency inductively coupled plasma atomic emission spectral analysis (ICP-AES analysis) for other elements. The α dose of the Sn sheet material was measured in the same manner as for the Cu ball, except that the Sn sheet material was spread on a flat shallow container of 300 mm×300 mm. The α dose of the Cu core ball was measured in the same manner as for the above-described Cu ball. In addition, the sphericity of the Cu core ball was also measured under the same conditions for the Cu ball. Table 3 shows the results of these measurements. As a comparative example, the α dose of the Sn sheet material was measured.

TABLE 3

| | Composition of solder coating film and Sn sheet material | | | | | | | | | | | | | | | α dose | |
|---|---|---|---|---|---|---|---|---|---|---|---|---|---|---|---|---|---|
| | Sn | Sb | Cu | Bi | Zn | Fe | Al | As | Ag | In | Cd | Ni | Pb | Au | U | Th | (cph/cm$^2$) | Sphericity |
| Executed Example 2 | bal. | 0 | 7092 | 0 | 0 | 0 | 0 | 0 | 1 | 0 | 0 | 3 | 4 | 1 | <0.2 | <0.2 | <0.0010 | 0.9918 |
| Sn sheet material | bal. | 11 | 0 | 18 | 0 | 5 | 0 | 21 | 6 | 11 | 0 | 30 | 49 | 1 | <0.2 | <0.2 | 0.203 | — |

* The unit of the elemental analysis result of the alloy composition is mass ppb only for U and Th.
The units of the other elements and total impurity amount are mass ppm.

Table 3 indicates that the α dose was higher than 0.2000 cph/cm² in the stage of the Sn sheet material, but the α dose was less than 0.0010 cph/cm² in Executed Example 2 wherein a solder layer of an Sn—Cu alloy was formed on the Cu ball using the Sn sheet material. It was verified that the α dose of the Cu core ball of Executed Example 2 was reduced by forming a solder plating film by a plating method.

The Cu core balls of Executed Example 2 showed no increase in the α dose, even after the lapse of two years after making.

Although the Cu core ball according to the present invention has been explained above, the shape of the present invention is not limited to a ball as long as the purpose of preventing the collapse of solder bumps by the self weight of the semiconductor packages can be achieved, and it may be applied to the above-described Cu core column Specifically, it may be applied to a column or a shaft of a column such as a triangle or square column which is composed of upper and lower surfaces having three or more sides directly contacting with the substrate. The Cu column to be the core may be formed by a known method, and the plating film covering the surface of the Cu column may be also formed by the above-described method used for the Cu core ball.

FIG. 2 is a schematically cross sectional side view of the Cu core column of the present embodiment for showing the configuration thereof and FIG. 3 is a schematically sectional plane view of the Cu core column of the present embodiment for showing the configuration thereof. The Cu core column 5 of the present embodiment is composed of a Cu column 6, and a solder layer 7 covering the Cu column 6.

The diameter of each of the top and bottom surfaces of the Cu column 6 constituting the Cu core column 5 according to the present invention is preferably from 1 to 1000 μm. In particular, when used for fine pitch, the diameter is more preferably from 1 to 300 μm, even more preferably from 1 to 200 μm, and most preferably from 1 to 100 μm. The height L of the Cu column 6 is preferably from 1 to 3000 μm. In particular, when used for fine pitch, the height is more preferably from 1 to 300 μm, even more preferably from 1 to 200 μm, and most preferably from 1 to 100 μm. When the diameter and height L of the Cu column 6 are within the above-described ranges, packaging can be performed while terminals have a narrow pitch, which can prevent short circuits, and allows size reduction and higher integration of semiconductor packages.

Preferred conditions of the purity, α dose, impurity content and the like of the Cu column 6 constituting the Cu core column 5 according to the present invention other than the size of the Cu column 6 are the same as those for the Cu ball 2 according to the present invention. For the Cu column 6, the sphericity is not required, so that there is no need to make the purity 4N5 or less, or make the impurity element content 50 ppm or more. However, there is no need to minimize the impurity content as long as the α dose can be reduced, and there is no need to minimize content of either Pb or Bi, or the total content of Pb and Bi as long as the U and Th contents are not higher than the specified value for reducing the α dose. The dropping strength and strength against heat cycle is not influenced even if the impurity content is not minimized.

In addition, preferred conditions of the solder composition, α dose, and impurity content of the solder layer 7 constituting the Cu core column 5 according to the present invention are the same as those for the solder layer 3 according to the present invention.

Further, preferred conditions of the α dose and the like of the Cu core column 5 according to the present invention are the same as those for the Cu core ball 1 according to the present invention.

The Cu core column 5 according to the present invention may have a diffusion prevention layer 8 formed between the Cu column 6 and the solder layer 7. The diffusion prevention layer 8 is composed of one or more elements selected from Ni, Co, and others, and prevents Cu composing the Cu column 6 from diffusing into the solder layer 7.

The Cu core column 5 according to the present invention may be used in a through-silicon via (TSV) for connecting the electrodes between the laminated semiconductor chips. TSV is produced by boring a hole in silicon by etching, forming an insulating layer and then a through-silicon conductor thereon in the hole in this order, polishing the upper and lower surfaces of the silicon, and exposing the through-silicon conductor at the upper and lower surfaces. In this process, the through-silicon conductor has been ordinarily formed by filling the hole with Cu or the like by plating. However, in such a method, the entire surface of the silicon is immersed in a plating solution, so that adsorption of impurities or moisture can occur. Therefore, the Cu core column 5 according to the present invention may be directly inserted into the hole formed in the silicon on a height direction, and used as a through-silicon conductor. When the Cu core column 5 is inserted into the silicon, it may be jointed by a solder material such as a solder paste. Alternatively, when the Cu core column 5 is inserted into the silicon, it may be jointed by a flux alone. As a result of this, failures such as the adsorption of impurities or moisture can be prevented, and the omission of the plating process can reduce the cost and time of manufacturing.

The above-described Cu core column 5 according to the present invention can achieve dropping strength and strength against heat cycle equivalent or superior to those of the solder column.

The invention claimed is:

1. A Cu core ball comprising:
a spherical core layer; and
a solder layer made of a solder alloy composed of Sn and Cu, the solder layer covering the core layer,
wherein in the core layer, purity of Cu is not less than 99.9% through not more than 99.995%;
a content of Pb is 10 ppm to 50 ppm;
a content of Bi is 10 ppm to 50 ppm;
a content of U is 5 ppb or less;
a content of Th is 5 ppb or less;
sphericity is 0.95 or more; and
an emitting α dose is 0.0200 cph/cm2 or less;
wherein in the solder layer, a content of U is 5 ppb or less; and
a content of Th is 5 ppb or less; and
wherein an α dose emitting from the Cu core ball is 0.0200 cph/cm2 or less.

2. The Cu core ball of claim 1, wherein the solder layer comprises not less than 0.1% through not more than 3.0% of Cu, the remainder being composed of Sn and impurities.

3. The Cu core ball of claim 2, wherein the core layer covered by a layer made of at least one element selected from Ni and Co is covered by the solder layer.

4. A solder paste comprising the Cu core ball of claim 1.

5. A solder joint comprising the Cu core ball of claim 1.

* * * * *